(12) United States Patent
Kino et al.

(10) Patent No.: US 12,384,885 B2
(45) Date of Patent: Aug. 12, 2025

(54) SUPPORT SUBSTRATE FOR DISPLAY DEVICE, ORGANIC EL DISPLAY DEVICE, AND MANUFACTURING METHOD FOR ORGANIC EL DISPLAY DEVICE

(71) Applicant: LG CHEM, LTD., Seoul (KR)

(72) Inventors: Takashi Kino, Shinagawa (JP); Chan Hyo Park, Daejeon (KR); Jinyoung Park, Daejeon (KR); Su Kyeong Kim, Daejeon (KR); Takashi Yamashita, Shinagawa (JP)

(73) Assignee: LG CHEM, LTD., Seoul (KR)

( * ) Notice: Subject to any disclaimer, the term of this patent is extended or adjusted under 35 U.S.C. 154(b) by 508 days.

(21) Appl. No.: 17/778,762

(22) PCT Filed: Jul. 13, 2020

(86) PCT No.: PCT/KR2020/009183
§ 371 (c)(1),
(2) Date: May 20, 2022

(87) PCT Pub. No.: WO2021/101008
PCT Pub. Date: May 27, 2021

(65) Prior Publication Data
US 2023/0006157 A1    Jan. 5, 2023

(30) Foreign Application Priority Data
Nov. 22, 2019  (JP) .................................. 2019-211567

(51) Int. Cl.
*C08G 73/10* (2006.01)
*H10K 59/12* (2023.01)
(Continued)

(52) U.S. Cl.
CPC ......... *C08G 73/1071* (2013.01); *C08G 73/10* (2013.01); *H10K 71/00* (2023.02);
(Continued)

(58) Field of Classification Search
CPC ........ H10K 77/10; H10K 59/12; H10K 71/00; H10K 85/10; H10K 59/1201;
(Continued)

(56) References Cited

U.S. PATENT DOCUMENTS 7,550,194 B2 *  6/2009  Simone .............. C08G 73/1039
                                                          428/339
10,431,753 B2 * 10/2019  Saeki ..................... C08G 73/14
(Continued)

FOREIGN PATENT DOCUMENTS

JP    2003-035905 A    2/2003
JP    2003-330006 A   11/2003
(Continued)

OTHER PUBLICATIONS

Xiao, Tianchen, et al. "High thermal conductivity and low absorptivity/ emissivity properties of transparent fluorinated polyimide films." Polymer Bulletin, vol. 74, No. 11, Mar. 13, 2017, pp. 4561-4575, https://doi.org/10.1007/s00289-017-1974-6. (Year: 2017).*

(Continued)

*Primary Examiner* — J. E. Schoenholtz
(74) *Attorney, Agent, or Firm* — ROTHWELL, FIGG, ERNST & MANBECK, P.C.

(57) ABSTRACT

The present disclosure is directed to providing a support substrate for a display device capable of obtaining high transparency while accomplishing thinning and flexibility of an organic EL display device.

In view of the above, the present disclosure provides a support substrate for a display device including a TFT glass substrate having a thickness of 10 μm to 150 μm, and a polyimide resin layer having a thickness of 150 nm or less installed in contact with the TFT glass substrate.

12 Claims, 1 Drawing Sheet

(51) Int. Cl.
    *H10K 59/80*     (2023.01)
    *H10K 71/00*     (2023.01)
    *H10K 77/10*     (2023.01)
    *H10K 85/10*     (2023.01)
    *H10K 102/00*     (2023.01)

(52) U.S. Cl.
    CPC ............ *H10K 77/10* (2023.02); *H10K 85/10* (2023.02); *H10K 59/12* (2023.02); *H10K 59/1201* (2023.02); *H10K 59/873* (2023.02); *H10K 2102/351* (2023.02)

(58) Field of Classification Search
    CPC .......... H10K 2102/351; H10K 59/873; H10K 71/80; C08G 73/10; C08G 73/1039; C08G 73/1053; C08G 73/1071; Y02E 10/549; G09F 9/00; G09F 9/30; H01L 27/12; H01L 27/1218; H01L 27/1262; H05B 33/02; H05B 33/10
    See application file for complete search history.

(56) References Cited

U.S. PATENT DOCUMENTS

| | | | |
|---|---|---|---|
| 2004/0012734 | A1 | 1/2004 | Yamanaka et al. |
| 2008/0138537 | A1* | 6/2008 | Simone .............. C08G 73/1039 524/600 |
| 2009/0051640 | A1 | 2/2009 | Tanaka et al. |
| 2011/0255034 | A1 | 10/2011 | Nakano et al. |
| 2014/0051192 | A1* | 2/2014 | Lee .................. B32B 17/10798 428/435 |
| 2015/0155505 | A1 | 6/2015 | Yamazaki et al. |
| 2016/0002407 | A1 | 1/2016 | Wakita et al. |
| 2016/0204164 | A1 | 7/2016 | Zhao et al. |
| 2017/0309844 | A1* | 10/2017 | Saeki .................. H10K 50/865 |
| 2020/0031997 | A1* | 1/2020 | Ren .................... C08G 73/1032 |
| 2021/0024699 | A1 | 1/2021 | Uno |
| 2021/0340325 | A1* | 11/2021 | Wang ................. C08G 73/1067 |

FOREIGN PATENT DOCUMENTS

| | | |
|---|---|---|
| JP | 2009-048007 A | 3/2009 |
| JP | 2011-014483 A | 1/2011 |
| JP | 2011-227205 A | 11/2011 |
| JP | 2015-223823 A | 12/2015 |
| JP | 2018-055103 A | 4/2018 |
| JP | 2018-101017 A | 6/2018 |
| JP | 2018-104525 A | 7/2018 |
| JP | 2019-039983 A | 3/2019 |
| KR | 10-2014-0023142 A | 2/2014 |
| KR | 10-2015-0060716 A | 6/2015 |
| KR | 10-2016-0023531 A | 3/2016 |
| KR | 10-2016-0065334 A | 6/2016 |
| KR | 10-2017-0103957 A | 9/2017 |
| WO | 2019-188265 A1 | 10/2019 |

OTHER PUBLICATIONS

Office Action issued for corresponding Japanese Patent Application No. 2019/211567 on Feb. 13, 2023, with English translation, 12 pages.

Office Action issued for corresponding Japanese Patent Application No. 2019/211567 on Jun. 19, 2023, with English translation, 13 pages.

International Search Report issued for International Application No. PCT/KR2020/009183 on Oct. 20, 2020, 4 pages.

Lee et al., "54.1: Invited Paper: A Novel approach to make flexible active matrix displays," SID10 Digest, 2010, pp. 810-813.

* cited by examiner

[FIG. 1]
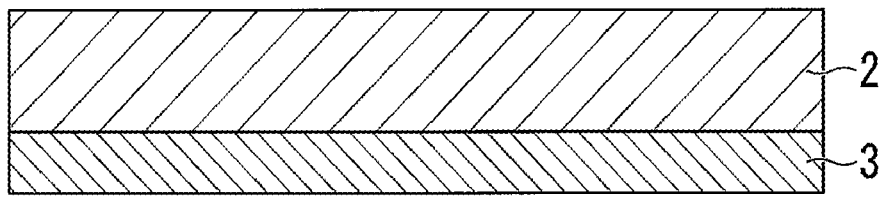
[FIG. 2]
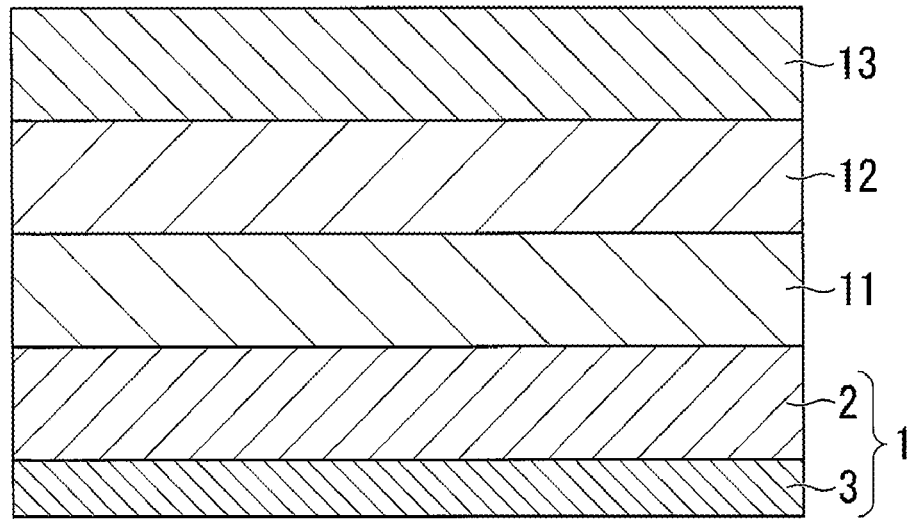

SUPPORT SUBSTRATE FOR DISPLAY DEVICE, ORGANIC EL DISPLAY DEVICE, AND MANUFACTURING METHOD FOR ORGANIC EL DISPLAY DEVICE

This application is a 35 U.S.C. 371 National Phase Entry Application from PCT/KR2020/009183 filed on Jul. 13, 2020, which claims priority to and the benefits of Japanese Patent Application No. 2019-211567, filed with the Japanese Intellectual Property Office on Nov. 22, 2019, the entire contents of which are incorporated herein by reference.

TECHNICAL FIELD

The present disclosure relates to a support substrate for a display device, an organic EL display device provided with the support substrate for a display device, and a method for manufacturing an organic EL display device.

BACKGROUND OF THE INVENTION

In the field of display devices such as an organic electroluminescence (hereinafter, also referred to as "organic EL") display device, weight lightening, miniaturization and flexibility of a product have been required recently. In such an organic EL display device, a transparent substrate made with glass or a resin has been used.

For example, it was disclosed that a display device having, using a thin glass substrate having a thickness of a few 10 μm or less, a thin film transistor circuit formed on this thin glass substrate, wherein the thin glass substrate is a glass substrate formed by forming a transparent resin film on a holding member, coating a coating glass material on the transparent resin film, then baking the result, and then removing the holding member.

In addition, it was also disclosed that an organic EL device including, as an electro-optical device having both flexibility and bending resistance even when reducing a total thickness of a glass substrate, an electro-optical layer sandwiched between a pair of glass substrates, an electro-optical panel having a first surface on a side from which light emits from the electro-optical layer, and a second surface on an opposite side of the first surface, a protective layer installed on the first surface of the electro-optical panel, a first surface layer installed above the protective layer, a resin layer installed so as to cover a side surface of the electro-optical panel and the second surface, and a second surface layer installed so as to face the second surface through the resin layer, wherein the protective layer has higher resistance for an etching solution compared to glass.

In addition, it was further disclosed that a method for manufacturing a flexible display device with favorable display qualities and high yield, the method including a process of forming an organic resin layer on a substrate, a process of forming an insulating film on the organic resin layer, a process of forming an element layer on the insulating film, a process of extending laser light by an optical system, a process of forming a linear beam by reducing the laser light, and, through the substrate, irradiating the linear beam on a process region of an interface between the substrate and the organic resin layer.

BRIEF SUMMARY OF THE INVENTION

However, an existing support substrate for a flexible organic EL display device including an organic resin layer is baked at approximately 450° C. when forming a thin film transistor (hereinafter, also referred to as "TFT") circuitry layer, and thereby has a problem in that the organic resin layer included in the substrate turns yellow. Therefore, in electronic devices such as portable information terminals equipped with a camera module and a display device such as smart phones or tablets, there have been problems of not being able to superimpose a camera module on the rear surface of the display device when the organic resin layer of the display device turns yellow.

In view of the above, the present disclosure is directed to providing a support substrate for a display device capable of obtaining high transparency while accomplishing thinning and flexibility of an organic EL display device.

The present disclosure is also directed to providing an organic EL display device having high transparency while being thin and having flexibility. In addition, the present disclosure is also directed to providing a method for manufacturing an organic EL display device capable of manufacturing an organic EL display device having high transparency while being thin and having flexibility.

As a result of extensive studies in view of the above, the inventors of the present disclosure have found out that, by a support substrate for a display device including a combination of a TFT glass substrate having a thickness of 10 μm to 150 μm, and a polyimide resin layer having a thickness of 150 nm or less and having high heat resistance installed in contact with the TFT glass substrate, coloring of the support substrate for a display device may be suppressed even when exposed to a high temperature, and the above-described problems may be resolved, and have completed the present disclosure.

Accordingly, a support substrate for a display device according to one embodiment of the present disclosure includes a TFT glass substrate having a thickness of 10 μm to 150 μm, and a polyimide resin layer having a thickness of 150 nm or less installed in contact with the TFT glass substrate.

The display device is preferably an organic EL display device.

The polyimide resin layer may have a thickness of 0.1 nm or greater.

The polyimide resin layer may have a thickness of 100 nm or less.

The TFT glass substrate may have a thickness of 30 μm to 100 μm.

The polyimide resin layer may be formed with a polyimide resin including, as an acid dianhydride, 4,4'-oxydiphthalic anhydride (ODPA), 3,3',4,4'-biphenyltetracarboxylic dianhydride (BPDA), 2,2-bis(4-(3,4-dicarboxyphenoМphenyl)propane dianhydride (BSAA), 4,4'-(hexafluoroisopropylidene)diphthalic anhydride (6FDA) or 1,2,3,4-cyclobutanetetracarboxylic dianhydride (CBDA), and, as diamine, 2,2-bis[3-(3-aminobenzamide)-4-hydroxyphenyl]hexafluoropropane (H FHA), trans-1,4-diaminocyclohexane or 2,2'-bis(trifluoromethyl)benzidine (TFMB).

The present disclosure also relates to an organic EL display device provided with the support substrate for a display device of the present disclosure.

The present disclosure also relates to a method for manufacturing an organic EL display device, and the method includes a process of forming a polyimide resin layer having a thickness of 20 nm to 150 nm on a glass substrate, a process of installing a TFT glass substrate having a thickness of 10 μm to 150 μm on the polyimide resin layer, a process of forming a TFT circuitry layer on the TFT glass substrate, a process of installing a light emitting layer including an organic layer on the TFT circuitry layer, and a process of encapsulating the light emitting layer with an encapsulation layer, and also includes a process of peeling the polyimide resin layer from the glass substrate by irradiating laser light on the polyimide resin layer.

Advantageous Effects

By using a support substrate for a display device of the present disclosure, an organic EL display device having high transparency while accomplishing thinning and flexibility can be provided. In addition, since the organic EL display device of the present disclosure includes the support substrate for a display device of the present disclosure, an organic EL display device having high transparency while being thin and having flexibility can be provided. In addition, by using a method for manufacturing an organic EL display device of the present disclosure, an organic EL display device having high transparency while being thin and having flexibility can be manufactured.

BRIEF DESCRIPTION OF DRAWINGS

FIG. 1 is a mimetic cross-sectional diagram illustrating a structure of a support substrate for a display device of the present disclosure.

FIG. 2 is a mimetic cross-sectional diagram illustrating a structure of an organic EL display device of the present disclosure.

DETAILED DESCRIPTION OF THE INVENTION

Hereinafter, embodiments of the present disclosure will be described in detail. The present disclosure is not limited to the following embodiments, and may be modified in various ways within the scope of the gist.

[Support Substrate for Display Device]

A support substrate for a display device of the present disclosure includes a TFT glass substrate having a thickness of 10 μm to 150 μm, and a polyimide resin layer having a thickness of 150 nm or less installed in contact with the TFT glass substrate.

The support substrate for a display device of the present disclosure is preferably a support substrate for an organic EL display device.

FIG. 1 is a mimetic cross-sectional diagram illustrating a structure of a support substrate for a display device of the present disclosure. The support substrate for a display device (1) of the present disclosure is formed with a TFT glass substrate (2) having a thickness of 10 μm to 150 μm, and a polyimide resin layer (3) having a thickness of 150 nm or less installed in contact with the TFT glass substrate (2). The polyimide resin layer (3) is preferably installed in contact with a surface opposite to the surface where a TFT circuitry layer is formed of the TFT glass substrate (2).

Since such a support substrate for a display device of the present disclosure is formed with a TFT glass substrate having a thickness of 10 μm to 150 μm and a polyimide resin layer having a thickness of 150 nm or less, thinning and flexibility may be obtained in the mounted display device. In addition, since a polyimide resin layer having a thickness of 150 nm or less and having high heat resistance is included, a display device having high transparency may be provided. Hereinafter, each component will be described in detail.

(TFT Glass Substrate)

The support substrate for a display device of the present disclosure includes a TFT glass substrate having a thickness of 10 μm to 150 μm.

The TFT glass substrate of the present disclosure functions not only as a support substrate for a display device, but also as a glass substrate for forming a TFT circuitry layer-formed TFT. The support substrate for a display device of the present disclosure has an advantage in that there is no need to form a gas barrier layer for forming a TFT compared to when using an existing flexible substrate material formed only with a polyimide film since the TFT glass substrate has excellent gas barrier properties.

The TFT glass substrate has a thickness of 10 μm to 150 μm. The TFT glass substrate of the present disclosure preferably has a thickness of 20 μm or greater and more preferably 30 μm or greater. In addition, the TFT glass substrate of the present disclosure preferably has a thickness of 125 μm or less and more preferably 100 μm or less. The thickness of the TFT glass substrate may be measured by observing, for example, the cross section using a scanning electron microscope (SEM).

(Polyimide Resin Layer)

The support substrate for a display device of the present disclosure includes a polyimide resin layer having a thickness of 150 nm or less installed in contact with the TFT glass substrate. The polyimide resin layer is installed in contact with a surface of the TFT glass substrate where a TFT circuitry layer is not formed.

The polyimide resin layer has a thickness of 150 nm or less, preferably 100 nm or less, more preferably 90 nm or less, and even more preferably 80 nm or less. A lower limit of the thickness of the polyimide resin layer is not particularly limited, however, the thickness is, for example, greater than 0 nm, 0.1 nm or greater, 1 nm or greater, 5 nm or greater, or 10 nm or greater. The thickness of the polyimide resin layer may be measured by observing, for example, the cross section using a transmission electron spectroscope (TEM). By employing the polyimide resin layer have a small thickness of 150 nm or less, an advantage of securing transparency of the support substrate for a display device is obtained even when the polyimide resin is exposed to a high temperature and turns yellow.

The polyimide resin layer is preferably formed with a transparent polyimide resin. Such a polyimide resin is not particularly limited, however, as a specific example, a polyimide resin represented by the following General Formula (11) may be used. This is obtained by imide ring closure (imidization reaction) of a polyimide precursor resin represented by the following General Formula (12). The method of imidization reaction is not particular limited, and may include thermal imidization or chemical imidization. Among these, thermal imidization is preferred in terms of heat resistance of the polyimide resin, and transparency in a visible region.

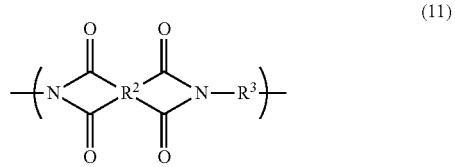

(11)

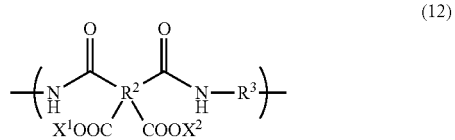

(12)

In General Formulae (11) and (12), $R^2$ represents a tetravalent organic group, and $R^3$ represents a divalent organic group. $X^1$ and $X^2$ each independently represent a hydrogen atom, a monovalent organic group having 1 to 10 carbon atoms, or a monovalent alkylsilyl group having 1 to 10 carbon atoms.

The polyimide precursor resin such as a polyamide acid, a polyamide acid ester or a polyamide acid silyl ester may be synthesized using a reaction of a diamine compound and an acid dianhydride or a derivative thereof. Examples of the derivative may include tetracarboxylic acids of the acid dianhydride, mono, di, tri or tetra esters of the tetracarboxylic acid, acid chlorides thereof and the like, and specifically, structures esterified with a methyl group, an ethyl group, an n-propyl group, an isopropyl group, an n-butyl group, a sec-butyl group, a tert-butyl group and the like may be included. The reaction method of the polymerization reaction is not particularly limited as long as it is capable of preparing a target polyimide precursor resin, and known reaction methods may be used.

As the specific reaction method, a method of introducing and dissolving all predetermined amounts of diamine components and a solvent in a reactor, introducing a predetermined amount of an acid dianhydride component thereto, and stirring the result for 0.5 hours to 30 hours at room temperature to 80° C., and the like may be included.

As the acid dianhydride and the diamine used in the polyimide precursor resin synthesis, those known in the art may be used.

The acid dianhydride is not particularly limited, and may include an aromatic acid dianhydride, an alicyclic acid dianhydride or an aliphatic acid dianhydride.

Examples of the aromatic acid dianhydride may include 4,4'-oxydiphthalic anhydride, pyromellitic dianhydride, 3,3',4,4'-biphenyltetracarboxylic dianhydride, 2,2-bis(4-(3,4-dicarboxyphenoMphenyl)propane dianhydride, 2,3,3',4'-biphenyltetracarboxylic dianhydride, 2,2',3,3'-biphenyltetracarboxylic dianhydride, 3,3',4,4'-terphenyltetracarboxylic dianhydride, 3,3',4,4'-oxyphthalic dianhydride, 2,3,3',4'-oxyphthalic dianhydride, 2,3,2',3'-oxyphthalic dianhydride, diphenylsulfone-3,3',4,4'-tetracarboxylic dianhydride, benzophenone-3,3',4,4'-tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,4-(3,4-dicarboxyphenoMbenzene dianhydride, bis(1,3-dioxo-1,3-dihydroisobenzofuran-5-carboxylic acid), 1,4-phenylene-2,2-bis(4-(4-aminophenoxy)phenyl)propane, 1,2,5,6-naphthalenetetracarboxylic dianhydride, 2,3,6,7-naphthalenetetracarboxylic dianhydride, 9,9-bis(3,4-dicarboxyphenyl)fluorene dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 2,2-bis(4-(3,4-dicarboxybenzoyloxy)phenyl)hexafluoropropane dianhydride, 1,6-difluoropyromelltic dianhydride, 1-trifluoromethylpyromellitic dianhydride, 1,6-ditrifluoromethylpyromellitic dianhydride, 2,2'-bis(trifluoromethyl)-4,4'-bis(3,4-dicarboxyphenoxy)biphenyl dianhydride, 2,2'-bis[(dicarboxyphenoxy)phenyl]propane dianhydride, 2,2'-bis[(dicarboxyphenoxy)phenyl]hexafluoropropane dianhydride, 9,9'-bis(3,4-dicarboxyphenyl)fluorenic dianhydride, or acid dianhydride compounds obtained by substituting aromatic rings thereof with an alkyl group, an alkoxy group, a halogen atom and the like, but are not limited thereto.

Examples of the alicyclic acid dianhydride may include 1,2,3,4-cyclobutanetetracarboxylic dianhydride, 1,2,4,5-cyclohexanetetracarboxylic dianhydride, 1,2,3,4-cyclopentanetetracarboxylic dianhydride, 1,2,3,4-tetra methyl-1,2,3,4-cyclobutanetetracarboxylic dianhydride, 1,2-dimethyl-1,2,3,4-cyclobutanetetracarboxylic dianhydride, 1,3-dimethyl-1,2,3,4-cyclobutanetetracarboxylic dianhydride, 1,2,3,4-cycloheptanetetracarboxylic dianhydride, 2,3,4,5-tetrahydrofurantetracarboxylic dianhydride, 3,4-dicarboxy-1-cyclohexylsuccinic dianhydride, 2,3,5-tricarboxycyclopentylacetic dianhydride, 3,4-dicarboxy-1,2,3,4-tetra hydro-1-naphthalenesuccinic dianhydride, bicyclo[3,3,0]octa ne-2,4,6,8-tetracarboxylic dianhydride, bicyclo[4,3,0]nonane-2,4,7,9-tetracarboxylic dianhydride, bicyclo[4,4,0]decane-2,4,7,9-tetracarboxylic dianhydride, bicyclo[4,4,0]decane-2,4,8,10-tetracarboxylic dianhydride, tricyclo[6,3,0,0<2,6>]undecane-3,5,9,11-tetracarboxylic dianhydride, bicyclo[2,2,2]octane-2,3,5,6-tetracarboxylic dianhydride, bicyclo[2,2,2]oct-7-ene-2,3,5,6-tetracarboxylic dianhydride, bicyclo[2,2,1]heptanetetracarboxylic dianhydride, bicyclo[2,2,1]hepta ne-5-carboxymethyl-2,3,6-tricarboxylic dianhydride, 7-oxa bicyclo[2,2,1]hepta ne-2,4,6,8-tetracarboxylic dianhydride, octahydronaphthalene-1,2,6,7-tetracarboxylic dianhydride, tetradecahydroanthracene-1,2,8,9-tetracarboxylic dianhydride, 3,3',4,4'-dicyclohexanetetracarboxylic dianhydride, 3,3',4,4'-oxydicyclohexanetetracarboxylic dianhydride, and 5-(2,5-dioxotetrahydro-3-furanyl)-3-methyl-3-cyclohexene-1,2-dicarboylic anhydride, and derivatives thereof, or acid dianhydride compounds obtained by substituting alicyclic rings thereof with an alkyl group, an alkoxy group, a halogen atom and the like, but are not limited thereto.

Examples of the aliphatic acid dianhydride may include 1,2,3,4-butanetetracarboxylic dianhydride, 1,2,3,4-pentanetetracarboxylic dianhydride, derivatives thereof and the like, but are not limited thereto.

These aromatic acid dianhydrides, alicyclic acid dianhydrides or aliphatic acid dianhydrides may be used either alone or as a combination of two or more types.

Among these, in terms of commercial availability and reactivity, using pyromellitic dianhydride, 3,3',4,4'-biphenyltetracarboxylic dianhydride, 3,3',4,4'-oxyphthalic dianhydride, 2,2-bis(3,4-dicarboxyphenyl)hexafluoropropane dianhydride, 2,2'-bis[(dicarboxyphenoxy)phenyl]propane dianhydride, 2,3,6,7-naphthalenetetracarboxylic dianhydride, 1,2,4,5-cyclohexanetetracarboxylic dianhydride, 3,3',4,4'-dicyclohexanetetracarboxylic dianhydride, 1,2,3,4-cyclobutanetetracarboxylic dianhydride, 4,4'-oxydiphthalic anhydride or 2,2-bis(4-(3,4-dicarboxyphenoxy)phenyl)propane dianhydride is preferred.

The diamine is not particularly limited, and aromatic diamine compounds, alicyclic diamine compounds or aliphatic diamine compounds may be included.

Examples of the aromatic diamine compound may include 3,4'-diaminodiphenyl ether, 4,4'-diaminodiphenyl ether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzidine, 2,2'-bis(trifluoromethyl)benzidine, 3,3'-bis(trifluoromethyl) benzidine, 2,2'-dimethyl benzidine, 3,3'-dimethylbenzidine, 2,2',3,3'-tetramethylbenzidine, 2,2'-dichlorobenzidine, 3,3'-dichlorobenzidine, 2,2',3,3'-tetrachlorobenzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis[4-(3-aminophenoxy)phenyl]sulfone, bis(4-aminophenoxy)biphenyl, bis{4-(4-aminophenoxy)phenyl}ether, 1,4-bis(4-aminophenoxy)benzene, 9,9-bis(4-aminophenyl)fluorene, 2,2'-bis[3-(3-aminobenzamide)-4-hydroxyphenyl]hexafluoropropane, 2,2-bis(3-amino-4-hydroxyphenyl)hexafluoropropane, 4-aminophenyl-4-aminobenzenesulfonate, 3-aminophenyl-4-aminobenzenesulfonate, 1,4-phenylene-bis(4-aminobenzenesulfonate), or diamine compounds obtained by substituting aromatic rings thereof with an alkyl group, an alkoxy group, a halogen atom and the like, but are not limited thereto.

Examples of the alicyclic diamine may include cyclobutanediamine, isophoronediamine, bicyclo[2,2,1]heptanebismethylamine, tricyclo[3,3,1,13,7]decane-1,3-diamine, 1,2-cyclohexyldiamine, 1,3-cyclohexyldiamine, 1,4-cyclohexyldiamine, trans-1,4-diaminocyclohexane, 4,4'-dianninodicyclohexylmethane, 3,3'-dimethyl-4,4'-diaminodicyclohexylmethane, 3,3'-diethyl-4,4'-dianninodicyclohexylmethane, 3,3',5,5'-tetramethyl-4,4'-diaminodicyclohexylnnethane, 3,3',5,5'-tetraethyl-4,4'-diaminodicyclohexylmethane, 3,5-diethyl-3',5'-dimethyl-4,4'-diaminodicyclohexylmethane, 4,4'-diaminodicyclohexyl ether, 3,3'-dimethyl-4,4'-diaminodicyclohexyl ether, 3,3'-diethyl-4,4'-diaminodicyclohexyl ether, 3,3',5,5'-tetramethyl-4,4'-diaminodicyclohexyl ether, 3,3',5,5'-tetraethyl-4,4'-diaminodicyclohexyl ether, 3,5-diethyl-3',5'-dimethyl-4,4'-diaminodicyclohexyl ether, 2,2-bis(4-aminocyclohexyl)propane, 2,2-bis(3-methyl-4-aminocyclohexyl)propane, 2,2-bis(3-ethyl-4-aminocyclohexyl)propane, 2,2-bis(3,5-dimethyl-4-aminocyclohexyl)propane, 2,2-bis(3,5-diethyl-4-aminocyclohexyl)propane, 2,2-(3,5-diethyl-3',5'-dimethyl-4,4'-diaminodicyclohexyl)propane, or diamine compounds obtained by substituting alicyclic ring thereof with an alkyl group, an alkoxy group, a halogen atom and the like, but are not limited thereto.

Examples of the aliphatic diamine may include alkylene diamines such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane or 1,10-diaminodecane, ethylene glycol diamines such as bis(aminomethyl)ether, bis(2-aminoethyl)ether or bis(3-aminopropyl)ether, and siloxane diamines such as 1,3-bis(3-aminopropyl)tetramethyldisiloxane, 1,3-bis(4-aminobutyl)tetramethyldisiloxane or α,ω-bis(3-aminopropyl)polydimethylsiloxane, but are not limited thereto.

These aromatic diamines, alicyclic diamines or aliphatic diamines may be used either alone or as a combination of two or more types.

Since heat resistance and high transparency in a visible region are required for the polyimide resin of the support substrate for a display device, having a trifluoromethyl group as a bulky fluorine substituent or an alicyclic monomer component in the acid dianhydride or the diamine component is preferred in order to provide transparency. In other words, the polyimide resin preferably has at least one type of group selected from among a trifluoromethyl group and an alicyclic hydrocarbon group. The trifluoromethyl group-containing monomer and the alicyclic monomer component may be used in both or one of the acid dianhydride and the diamine component, however, in terms of monomer availability, using in the diamine component is preferred. In addition, in order to exhibit sufficient transparency, a diamine residue having at least one type of group selected from among a trifluoromethyl group or an alicyclic hydrocarbon group is preferably included in 50 mol % or greater with respect to a total amount of the diamine residue included in the polyimide resin.

As another preferred embodiment, 4,4'-oxydiphthalic anhydride (ODPA), 3,3',4,4'-biphenyltetracarboxylic dianhydride (BPDA), 4,4'-(hexafluoroisopropylidene)diphthalic anhydride (6FDA), 2,2-bis(4-(3,4-dicarboxyphenoxy)phenyl)propane dianhydride (BSAA), 1,2,3,4-cyclobutanetetracarboxylic dianhydride (CBDA) or 1,2,4,5-cyclohexanetetracarboxylic dianhydride (PMDA-H) is preferably included as the acid dianhydride. As the diamine, 2,2-bis[3-(3-aminobenzamide)-4-hydroxyphenyl]hexafluoropropane (HFHA), trans-1,4-diaminocyclohexane (t-DACH) or 2,2'-bis(trifluoromethyl)benzidine (TFMB) is preferably included.

In addition, as another preferred embodiment, 3,3',4,4'-biphenyltetracarboxylic dianhydride (BPDA), 4,4'-oxydiphthalic anhydride (ODPA), 1,2,4,5-cyclohexanetetracarboxylic dianhydride (PMDA-H), 2,2-bis(4-(3,4-dicarboxyphenoMphenyl)propane dianhydride (BSAA) 4,4'-(hexafluoroisopropylidene)diphthalic anhydride (6FDA) or 1,2,3,4-cyclobutanetetracarboxylic dianhydride (CBDA) is preferably included as the acid dianhydride, and as the diamine, 4,4'-diaminodiphenyl ether, p-phenylenediamine, 3,3'-dimethylbenzidine, 2,2-bis[3-(3-aminobenzamide)-4-hydroxyphenyl]hexafluoropropane (HFHA), trans-1,4-diaminocyclohexane or 2,2'-bis(trifluoromethyl)benzidine (TFMB) is preferably included.

In particular, it is effective to introduce a trifluoromethyl group or an alicyclic monomer component to the acid dianhydride or the diamine component for the purposes of obtaining a support substrate for a display device having high transparency. As the acid dianhydride in this case, 4,4'-oxydiphthalic anhydride (ODPA), 3,3',4,4'-biphenyltetracarboxylic dianhydride (BPDA), 2,2-bis(4-(3,4-dicarboxyphenoxy)phenyl)propane dianhydride (BSAA), 4,4'-(hexafluoroisopropylidene)diphthalic anhydride (6FDA) or 1,2,3,4-cyclobutanetetracarboxylic dianhydride (CBDA) is preferably included. As the diamine, 2,2-bis[3-(3-aminobenzamide)-4-hydroxyphenyl]hexafluoropropane (H FHA), or trans-1,4-diaminocyclohexane or 2,2'-bis(trifluoromethyl)benzidine (TFMB) is preferably included.

As a particularly preferred polyimide resin, polyimide employing at least one of repeating structure units represented by General Formulae (1) to (3) as a main component may be included.

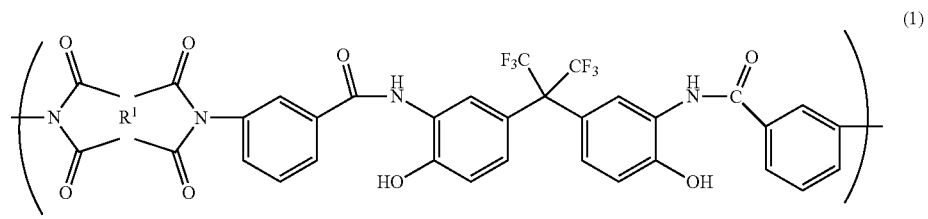

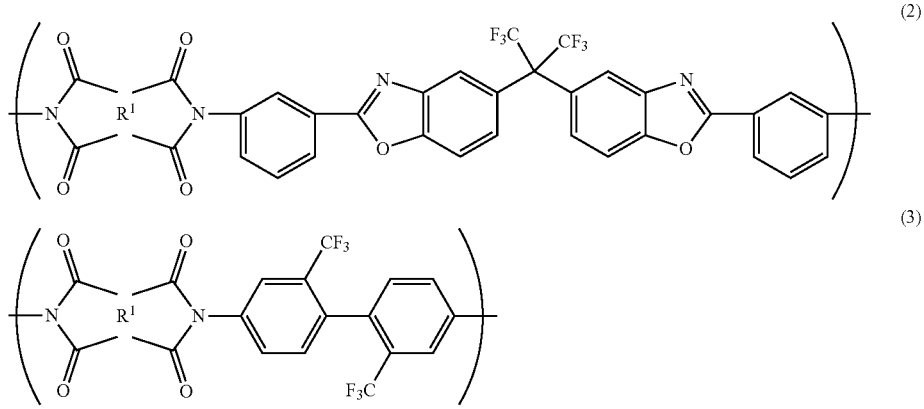

(2)

(3)

In General Formulae (1) to (3), $R^1$ is at least one or more types of groups represented by (4) to (9).

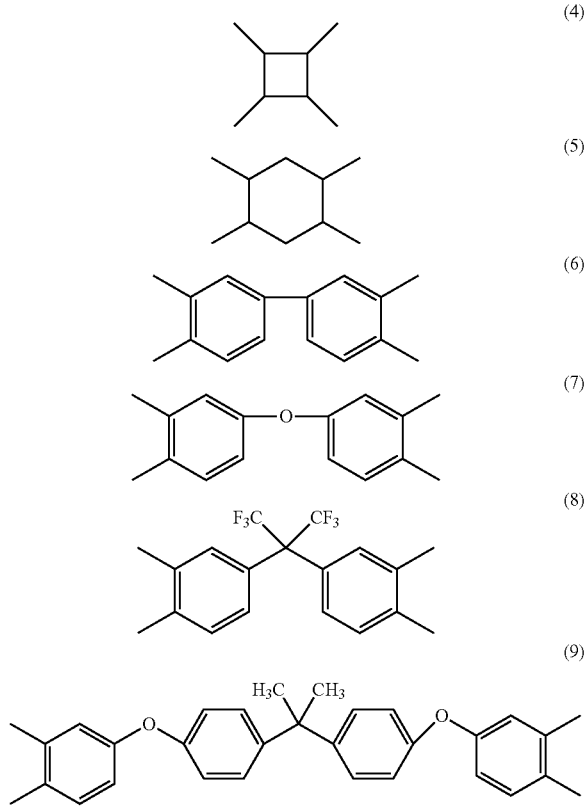

The polyimide and the polyimide precursor resin may be sealed at both ends using an end sealant in order to adjust the molecular weight to a preferred range. Examples of the end sealant reacting with the acid dianhydride may include monoamines, monovalent alcohols and the like. In addition, examples of the end sealant reacting with the diamine compound may include acid anhydrides, monocarboxylic acids, monoacid chloride compounds, monoactive ester compounds, decarbonate esters, vinyl ethers and the like. In addition, by reacting the end sealant, various organic groups may be introduced as the end group.

The support substrate for a display device of the present disclosure may exhibit high transparency even when exposed to a high temperature. For example, the support substrate for a display device of the present disclosure maintains high transparency even when exposed for 120 minutes at 450° C., and specifically, may have total light transmittance of 70% or greater, preferably 80% or greater and more preferably 90% or greater in a visible region. The total light transmittance in a visible region may be measured using, for example, a visible light transmittance meter.

[Organic EL Display Device]

The present disclosure also relates to an organic EL display device including the support substrate for a display device of the present disclosure described above.

FIG. 2 is a mimetic cross-sectional diagram illustrating a structure of the organic EL display device of the present disclosure. The organic EL display device (10) of the present disclosure includes a structure in which the support substrate for a display device (1) described above is provided, a TFT circuitry layer (11) is installed on a TFT glass substrate (2) of the support substrate for a display device (1), a light emitting layer (12) including an organic layer electrically connected to a driving circuit of the TFT circuitry layer is installed on the TFT circuitry layer (11), and an encapsulation layer (13) is installed on the light emitting layer (12). In addition, the organic EL display device of the present disclosure may have a bottom emission structure or a top emission structure.

The TFT circuitry layer is not particularly limited, and examples thereof may include a TFT circuitry layer formed with a thin film transistor having a semiconductor layer formed with amorphous silicon, polycrystalline silicon, low-temperature polysilicon or microcrystalline silicon. The TFT circuitry layer commonly includes, in addition to the above-described semiconductor layer, a gate electrode, a gate insulating film, a source electrode and a drain electrode installed on the TFT glass substrate.

The light emitting layer may be a light emitting layer including organic layers known in the art, and is generally a light emitting layer formed with an anode electrode, a multilayer-structured organic layer including an organic compound, and a cathode electrode. In one embodiment, the light emitting layer may include a hole injection layer, a hole transfer layer, an organic layer, an electron transfer layer and an electron injection layer consecutively laminated on the first electrode. Herein, one, two or more layers of the hole injection layer, the hole transfer layer, the electron transfer layer and the electron injection layer may not be included.

In addition, the light emitting layer may further include at least one functional layer for controlling electrons and/or holes injected to the light emitting layer.

The encapsulation layer is for preventing oxygen and/or moisture from penetrating the light emitting layer. Materials forming the encapsulation layer are not particularly limited, and, the encapsulation layer may be formed as an inorganic layer or an organic layer, or formed in a multilayer structure in which an inorganic layer and an organic layer are alternately laminated. Examples of the inorganic layer material may include silicon nitride (SiNx), silicon oxide (SiOx), silicon oxynitride (SiON) or aluminum oxide (AlxOy), and examples of the organic layer material may include a benzocyclobutene resin, an epoxy resin, an acrylic resin, a polyamide resin, a polyimide resin or the like.

The organic EL display device of the present disclosure may have other functional layers installed in addition to the above-described layer structures. Examples of such other functional layers may include a touch panel layer, a hard coating layer, an adhesive layer, an antireflection layer, an antistatic layer and the like.

The organic EL display device of the present disclosure has high transparency. Preferably, the organic EL display device of the present disclosure may have total light transmittance of 70% or greater, preferably 80% or greater and more preferably 90% or greater in a visible region. The total light transmittance in a visible region may be measured using, for example, a visible light transmittance meter.

Such an organic EL display device of the present disclosure uses, as a support substrate, the support substrate for a display device of the present disclosure formed with a TFT glass substrate having a thickness of 10 µm to 150 µm, and a polyimide resin layer having a thickness of 150 nm or less and having high heat resistance installed in contact with the TFT glass substrate, and as a result, high transparency is obtained while being thin and having flexibility.

[Method for Manufacturing Organic EL Display Device]

The present disclosure also relates to a method for manufacturing an organic EL display device. The method for manufacturing an organic EL display device of the present disclosure includes a process of forming a polyimide resin layer having a thickness of 20 nm to 150 nm on a glass substrate, a process of installing a TFT glass substrate having a thickness of 10 µm to 150 µm on the polyimide resin layer, a process of forming a TFT circuitry layer on the TFT glass substrate, a process of installing a light emitting layer on the TFT circuitry layer, and a process of encapsulating the light emitting layer with an encapsulation layer, and also includes a process of peeling the polyimide resin layer from the glass substrate by irradiating laser light on the polyimide resin layer.

The process of forming a polyimide resin layer having a thickness of 20 nm to 150 nm on a glass substrate is a process of installing a polyimide resin layer having a thickness of 20 nm to 150 nm on a glass substrate that is a carrier substrate. The method for forming a polyimide resin layer is not particularly limited, however, the polyimide resin layer may be formed by coating a precursor NMP solution of the polyimide resin to a thickness of 100 nm to 750 nm, and then drying and curing the result. The drying condition is not particularly limited, but may be, for example, heating for 10 minutes to 10 hours at 50° C. to 300° C. In addition, the curing condition is not particularly limited, but may be, for example, heating for 10 minutes to 3 hours at a temperature of higher than 300° C. to 500° C. The method of coating a polyimide resin is not particularly limited, and methods known in the art may be used, and for example, a spin coating method, a slit coating method, a spray coating method, a roll coating method, a bar coating method and the like may be included as an example. Curing of a polyimide resin is normally conducted by heating. In addition, the thickness of the glass substrate that is a carrier substrate is not particularly limited, and, for example, may be from 0.1 mm to 30 mm.

The process of installing a TFT glass substrate having a thickness of 10 µm to 150 µm on the polyimide resin layer is a process of laminating a glass substrate for forming a TFT circuit on the polyimide resin layer obtained in the above-described process. The polyimide resin layer and the TFT glass substrate are normally adhered by heating. The heating condition is not particularly limited, but may be, for example, heating for 1 minute to 30 minutes at 300° C. to 400° C.

The process of forming a TFT circuitry layer on the TFT glass substrate is a process of forming a TFT circuit on the TFT glass substrate laminated in the above-described process. The process of forming a TFT circuit is conducted by forming a gate electrode, a gate insulating film, a semiconductor layer, a source electrode and a drain electrode using methods known in the art. In addition, although the TFT circuitry layer is not particularly limited, examples thereof may include a TFT circuitry layer formed with a thin film transistor having a semiconductor layer formed with amorphous silicon, polycrystalline silicon, low-temperature polysilicon or microcrystalline silicon. Such a process of forming a TFT circuitry layer commonly includes a process of annealing a semiconductor layer for 1 hour to 5 hours at 400° C. to 450° C.

The process of installing a light emitting layer including an organic layer on the TFT circuitry layer is a process of forming an organic EL light emitting layer on the TFT circuitry layer formed in the above-described process. The light emitting layer may be formed using methods known in the art, and may commonly include a hole injection layer, a hole transfer layer, an organic layer, an electron transfer layer and an electron injection layer consecutively laminated on a first electrode. Herein, a driving circuit of the TFT circuitry layer and the light emitting layer are electrically connected. Each of the layers may be formed using a deposition method, or may be formed using a coating method.

The process of encapsulating the light emitting layer with an encapsulation layer is a process of installing an encapsulation layer on the light emitting layer formed in the above-described process. Materials forming the encapsulation layer are not particularly limited, and, may be formed as an inorganic layer or an organic layer, or formed in a multilayer structure in which an inorganic layer and an organic layer are alternately laminated. Examples of the inorganic layer material may include silicon nitride (SiNx), silicon oxide (SiOx), silicon oxynitride (SiON) or aluminum oxide (AlxOy), and examples of the organic layer material may include a benzocyclobutene resin, an epoxy resin, an acrylic resin, a polyamide resin, a polyimide resin or the like. In addition, the encapsulation layer may be formed using methods known in the art, and for example, a sputter method, a vacuum deposition method, a plasma CVD method, an ion plating method and the like may be used.

The method for manufacturing an organic EL display device of the present disclosure also includes, in addition to the above-described processes, a process of peeling the polyimide resin layer from the glass substrate by irradiating laser light on the polyimide resin layer. In other words, the method for manufacturing an organic EL display device of the present disclosure includes a process of, in order to take out the organic EL display device, peeling the polyimide resin layer from the glass substrate by irradiating laser light on the polyimide resin layer and thereby changing an interface between the glass substrate that is a carrier substrate and the polyimide resin.

In the process of peeling the polyimide resin layer from the glass substrate, laser light is irradiated on the polyimide resin layer from a side of the glass substrate that is a carrier substrate. The wavelength of the laser light is not particularly limited as long as it is capable of changing the polyimide resin, but is normally ultraviolet. The laser light is preferably irradiated using a laser lift off method.

The changing of an interface between the glass substrate and the polyimide resin by irradiating laser light on the polyimide resin layer may include baking of the polyimide resin layer. Therefore, the thickness of the polyimide resin layer decreases by irradiating laser light, and the thickness of the polyimide resin layer after the peeling may be smaller than the thickness of the polyimide resin layer originally formed. In other words, the thickness of the polyimide resin layer of the organic EL display device after the peeling is 150 nm or less, preferably 100 nm or less, more preferably 90 nm or less and even more preferably 80 nm or less. A lower limit of the thickness of the polyimide resin layer is not particularly limited, however, the thickness is, for example, greater than 0.01 nm, 0.1 nm or greater, 1 nm or greater, 5 nm or greater, or 10 nm or greater. The thickness of the polyimide resin layer may be measured by observing, for example, the cross section using a transmission electron spectroscope (TEM).

In existing technologies, there has been a problem in that, when a 10 μm to 150 μm thin layer glass substrate is used as a support substrate and this thin layer glass substrate is in direct contact with a glass substrate as a carrier substrate, peeling the thin layer glass substrate from the glass substrate becomes difficult when exposed to a high temperature during a process of forming a TFT circuit. The peeling process of the present disclosure is a case of installing a polyimide resin layer with high heat resistance between a glass substrate as a carrier substrate and a thin layer glass substrate, and using the thin layer glass substrate as a support substrate by changing the interface between the polyimide resin layer and the glass substrate using laser light, and the support substrate may be readily peeled from the glass substrate even when exposed to a high temperature. Accordingly, the present disclosure also relates to a use of a polyimide resin composition for peeling a 10 μm to 150 μm thin layer glass substrate from a glass substrate as a carrier substrate, and this polyimide resin composition forms a polyimide resin layer having a thickness of 150 nm or less.

According to the method for manufacturing an organic EL display device of the present disclosure, an organic EL display device including a support substrate for a display device formed with a TFT glass substrate having a thickness of 10 μm to 150 μm and a polyimide resin layer having a thickness of 150 nm or less installed in contact with the TFT glass substrate may be manufactured, and as a result, an organic EL display device having high transparency while being thin and having flexibility may be manufactured.

Hereinafter, the present disclosure will be described in detail with reference to the following example and comparative example. However, the present disclosure is not limited to the descriptions of the following example.

Example

A varnish including 4,4'-oxydiphthalic anhydride (ODPA) as an acid dianhydride and 2,2'-bis(trifluoromethyl)benzidine (TFMB) as a diamine was coated to a thickness of 500 nm on a glass substrate having a thickness of 0.5 mm using a slot die. The result was introduced to a nitrogen oven (manufactured by Koyo Thermo Systems Korea, Co., Ltd.), and dried for 30 minutes at 50° C., then dried for 30 minutes at 100° C., dried for 30 minutes at 150° C., dried for 30 minutes at 200° C., dried for 30 minutes at 250° C., dried for 30 minutes at 300° C., and cured for 30 minutes at 350° C. to form a polyimide resin layer having a thickness of 100 nm. Subsequently, thin layer glass (manufactured by Nippon Electric Glass Co., Ltd.) having a thickness of 50 μm was laminated on the polyimide resin layer as a TFT glass substrate, and the result was heated for 10 minutes at 350° C. to adhere the polyimide resin layer and the thin layer glass as a TFT glass substrate. Subsequently, a TFT circuitry layer and a light emitting layer were formed on the thin layer glass using known methods, and an encapsulation layer was formed on the light emitting layer to form a display device on the glass substrate. In the process of forming a TFT circuitry layer, a semiconductor layer was annealed for 2 hours at 450° C. Lastly, the polyimide resin layer was peeled from the glass substrate by irradiating laser light with a wavelength of 308 nm on the polyimide resin layer from a surface opposite to the display device-laminated surface of the glass substrate using a laser lift off method, and as a result, an organic EL display device was obtained. The thickness of the polyimide resin layer of the obtained organic EL display device measured by observing a cross-section TEM was 70 nm.

Comparative Example

An organic EL display device was manufactured in the same manner as in Example except that thin layer glass was laminated on an epoxy resin layer using a general epoxy resin layer instead of the polyimide resin layer, and then the result was heated for 10 minutes at 160° C. In the process of forming a TFT circuitry layer, the epoxy resin layer foamed when annealing a semiconductor layer for 2 hours at 450° C., and an organic EL display device was not able to be manufactured since the epoxy resin layer and the thin layer glass were peeled off.

[Evaluation]

(Visible Light Transmission Test)

Transmittance of the organic EL display device obtained in Example for visible light was measured using a visible light transmittance meter (manufactured by Nippon Spectroscopy, UV-500). The organic EL display device of Example had total light transmittance of 90% or greater in a visible region. Therefore, the organic EL display device of the present disclosure had excellent transparency.

INDUSTRIAL APPLICABILITY

The support substrate for a display device of the present disclosure has high transparency, and, for example, is particularly useful for electronic devices equipped with a plurality of modules such as smart phones or tablets. For example, in electronic devices such as portable information terminals equipped with a camera module and a display device, it is possible to install the camera module on the back of the display device.

The invention claimed is:
1. A support substrate for a display device comprising:
 a TFT glass substrate having a thickness of 10 μm to 150 μm;

a polyimide resin layer having a thickness of 150 nm or less installed in contact with the TFT glass substrate; and a TFT circuitry layer installed on the TFT glass substrate, wherein the TFT circuitry layer is installed in contact with the TFT glass substrate on a side of the TFT glass substrate that is opposite to the side of the TFT glass substrate in contact with the polyimide resin layer, wherein the polyimide resin layer comprises a polyimide resin formed from at least one acid dianhydride selected from 4,4'-oxydiphthalic anhydride (ODPA), 3,3',4,4'-biphenyltetracarboxylic dianhydride (BPDA), 2,2-bis(4-(3,4-dicarboxyphenoxy) phenyl) propane dianhydride (BSAA), 4,4'-(hexafluoroisopropylidene) diphthalic anhydride (6FDA) or 1,2,3,4-cyclobutanetetracarboxylic dianhydride (CBDA) and at least one diamine selected from 2,2-bis [3-(3-aminobenzamide)-4-hydroxyphenyl] hexafluoropropane (HFHA), trans-1,4-diaminocyclohexane or 2,2'-bis(trifluoromethyl) benzidine (TFMB), and wherein the support substrate has a total light transmittance of 70% or greater in a visible region after exposure to heat at 450° C. for 120 minutes.

2. The support substrate for a display device of claim 1, wherein the display device is an organic EL display device.

3. The support substrate for a display device of claim 1, wherein the polyimide resin layer has a thickness of 0.1 nm or greater.

4. The support substrate for a display device of claim 1, wherein the polyimide resin layer has a thickness of 100 nm or less.

5. The support substrate for a display device of claim 1, wherein the TFT glass substrate has a thickness of 30 μm to 100 μm.

6. An organic EL display device comprising the support substrate for a display device of claim 1.

7. A method for manufacturing an organic EL display device, the method comprising:

a process of forming a polyimide resin layer having a thickness of 20 nm to 150 nm on a glass substrate;

a process of forming a TFT glass substrate having a thickness of 10 μm to 150 μm on the polyimide resin layer;

a process of forming a TFT circuitry layer on the TFT glass substrate on a side of the TFT glass substrate that is opposite to the side of the TFT glass substrate in contact with the polyimide resin layer;

a process of installing a light emitting layer including an organic layer on the TFT circuitry layer; and a process of encapsulating the light emitting layer with an encapsulation layer, and a process of peeling the polyimide resin layer from the glass substrate by irradiating laser light on the polyimide resin layer.

8. An organic EL display device comprising the support substrate for a display device of claim 2.

9. An organic EL display device comprising the support substrate for a display device of claim 3.

10. An organic EL display device comprising the support substrate for a display device of claim 4.

11. An organic EL display device comprising the support substrate for a display device of claim 5.

12. The support substrate for a display device of claim 1, wherein the polyimide resin comprises at least one of repeating structure units represented by Formulae (1) to (3):

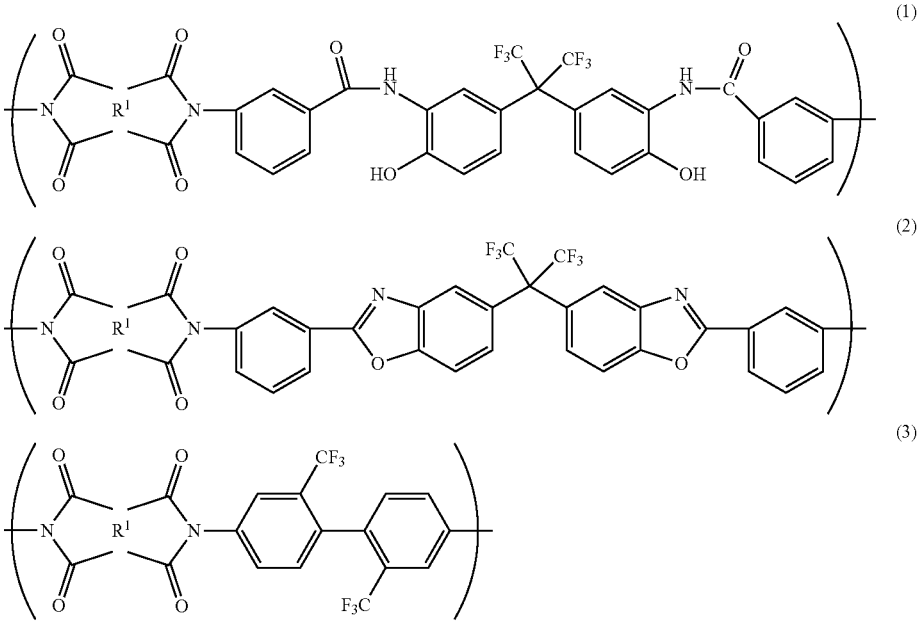

wherein, in the Formulae (1) to (3), $R^1$ is at least one or more groups represented by (4) to (9):

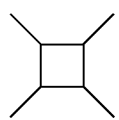

-continued
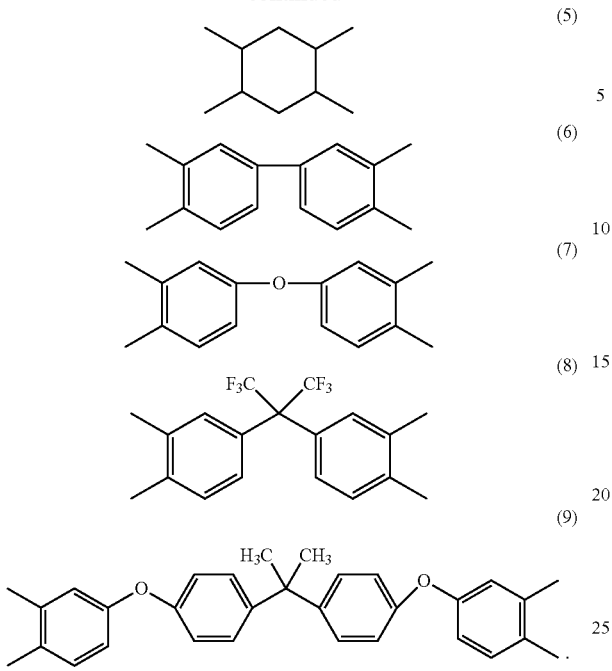
* * * * *